United States Patent
Zhu et al.

[19]

[11] Patent Number: 5,933,047
[45] Date of Patent: Aug. 3, 1999

[54] HIGH VOLTAGE GENERATING CIRCUIT FOR VOLATILE SEMICONDUCTOR MEMORIES

[75] Inventors: Jieyan Zhu; Valerie Lines, both of Ottawa, Canada

[73] Assignee: Mosaid Technologies Incorporated, Kanata, Canada

[21] Appl. No.: 08/841,322

[22] Filed: Apr. 30, 1997

[51] Int. Cl.[6] .................................................... H03K 3/01
[52] U.S. Cl. ...................... 327/534; 327/536; 327/537; 327/544
[58] Field of Search .............................. 363/60; 327/534, 327/535, 536, 537, 589, 390, 544

[56] References Cited

U.S. PATENT DOCUMENTS

| | | | |
|---|---|---|---|
| 5,126,590 | 6/1992 | Chern | 327/536 |
| 5,157,279 | 10/1992 | Lee | 307/296.2 |
| 5,196,996 | 3/1993 | Oh | 363/60 |
| 5,394,365 | 2/1995 | Tsukikawa | 365/189.09 |
| 5,521,546 | 5/1996 | Kim | 327/536 |
| 5,521,871 | 5/1996 | Choi | 365/189.11 |
| 5,557,231 | 9/1996 | Yamaguchi et al. | 327/534 |
| 5,568,065 | 10/1996 | Wert et al. | 326/33 |
| 5,594,381 | 1/1997 | Bingham | 327/534 |
| 5,633,825 | 5/1997 | Sakuta et al. | 327/536 |
| 5,748,032 | 5/1998 | Baek | 327/536 |
| 5,790,393 | 8/1998 | Fotouhi | 327/536 |

*Primary Examiner*—Timothy P. Callahan
*Assistant Examiner*—Jung Ho Kim
*Attorney, Agent, or Firm*—Kevin Pillay; Santosh K. Chari; John R. S. Orange

[57] ABSTRACT

A high voltage generating circuit which provides a constant $V_{PP}$ output without any threshold voltage drop and which does not suffer from latch-up problems is described. Thus a voltage boosting circuit which provides for a boosted voltage $V_{PP}$ at an output node, from a supply voltage $V_{DD}$, includes a precharge transistor element responsive to a precharge clock signal for transferring the supply voltage $V_{DD}$ to a boost node for precharging the boost node to the full supply voltage $V_{DD}$. The circuit further includes a capacitive element connected between the boost node and a pump node, the capacitive element pumping the boost node in response to a pump voltage signal applied to the pump node; and a switching element connected between the boost node and the output node, for transferring charge from the capacitive element to the output node to provide the boosted voltage $V_{PP}$. In particular the precharge transistor element is an PMOS transistor. Furthermore in order to prevent latch-up of the PMOS devices, a switching circuit is provided to maintain the substrate at the highest voltage in the circuit.

17 Claims, 4 Drawing Sheets

HIGH VOLTAGE GENERATING CIRCUIT FOR VOLATILE SEMICONDUCTOR MEMORIES

This invention relates to a high voltage generating circuit for use in random access memories.

BACKGROUND OF THE INVENTION

Semiconductor devices such as Dynamic Random Access Memories (DRAMs), synchronous DRAMs (SDRAMs) or other types of volatile memories generally utilize CMOS semiconductor devices. Power for these devices is provided by a standard voltage supply having a positive voltage $V_{DD}$ relative to a ground voltage $V_{SS}$. As is well known, data bits having either logic high state or logic low state are stored in memory cell locations. The high logic level stored in a memory cell generally corresponds to a voltage equivalent to $V_{DD}$ while the low logic level corresponds to the ground voltage $V_{SS}$.

Specifically in dynamic memories, the data bit is stored in a capacitor, which is charged or discharged through a memory cell access transistor. Typically, NMOS devices have been used in the memory cell array since they take up a smaller layout area, and are thus better suited for higher integration. Using an NMOS access transistor however, requires providing a voltage higher than $V_{DD}$ to the gate of the memory cell access transistor in order to fully turn it on and avoid any threshold voltage drop. The requirement for generation of a voltage supply, which is higher than $V_{DD}$ thus, arises. Various circuits have been devised for generating such high voltages for use in volatile memories. Generally, this boosted supply voltage level is referred to symbolically as $V_{PP}$. This naming convention traces its origins to nonvolatile memories such as EEPROMs and Flash EPROMs wherein programming voltages are generated for cell programming. Although some similarities exist, the generation of $V_{PP}$ in volatile memories has different design goals and approaches than generating $V_{PP}$ in nonvolatile memories.

A conventional prior art circuit for generating a $V_{PP}$ voltage level from $V_{DD}$ is described with reference to FIG. 1. The circuit illustrated in FIG. 1 employs a conventional ring oscillator (not shown) to generate a $V_{DD}$ level oscillating signal OSC_PUMP, the output of which is connected to an NMOS capacitor C1 for functioning as a charge pump. A second NMOS device T2, with its source-drain path connected between $V_{DD}$ and the charge pump capacitor C1 at node 1, is used for pre-charging the capacitor C1. Furthermore, A main driving PMOS pass transistor T3 is connected between the charge pump capacitor C1 at node 1 and a $V_{PP}$ output.

In operation, the ring oscillator 1 generates an oscillating signal OSC_PUMP with a constant period $T_{osc}$ and an amplitude of the source supply voltage $V_{DD}$ which is provided to one plate of the charge pumping capacitor C1. The other plate of C1 is cyclically precharged by transistor T2 which in turn also receives a $V_{DD}$ level oscillating signal OSC_PRECHARGE at its gate.

When the oscillating signal OSC_PUMP is at the ground voltage $V_{SS}$, the voltage across the C1 is $V_{DD}-V_{TN}$, where $V_{TN}$ is a threshold voltage loss of the NMOS transistor T2. When the oscillator voltage changes from $V_{SS}$ to $V_{DD}$, the voltage at the node 1 will also rise from a voltage $V_{DD}-V_{TN}$ to a voltage of approximately $2V_{DD}-V_{TN}$, due to the capacitive coupling effect of capacitor C1. The voltage is transferred to the output $V_{PP}$ when the PMOS pass transistor T3 is turned on. The voltage $V_{PP}$ may be charged into a load capacitor $C_L$ (not shown). The oscillation is continued to maintain the $V_{PP}$ potential. Optionally, a level detector and regulator may be included to pause the pumping action during periods requiring little power.

A disadvantage of this NMOS precharge, PMOS pass generating circuit is that there is always a threshold voltage $V_{TN}$ loss at a boost node 1. Thus, when $V_{DD}$ is low, for example during power-up, or at less than $2V_{TN}$, the circuit will not work.

A cross-coupled charge pump circuit using a two-phase charge pump shown in FIG. 2 has been implemented as an improvement over the circuit of FIG. 1. This circuit is capable of compensating for the threshold voltage loss at the boost node due to the bootstrap action of the precharge devices. However, this circuit still has the disadvantage of having a threshold voltage loss in the diode-type NMOS devices T4 at the output stage.

An alternate to the cross-coupled charge pump configuration of FIG. 2 was proposed in U.S. Pat. No. 5,196,996. The circuit shown in FIG. 3 comprises a clamping circuit, a charge pump circuit and a charge transfer circuit. The clamping circuit is provided with an NMOS capacitor C4 having one of its plates connected to a first precharging oscillating signal OSC_PRECHARGE. A diode-type NMOS device T5 is also provided having its gate and drain coupled to a source supply voltage $V_{DD}$ and its source connected to the gate of an NMOS transistor T6 and the other plate of capacitor C4.

The charge pump circuit is provided with an NMOS capacitor C5 having one of its plates coupled to a second main pump oscillating signal OSC_PUMP. The other plate of capacitor C5 and the drain of the NMOS transistor T6 are coupled via a PMOS pass transistor T7 to the output $V_{PP}$.

Since the gate of the precharging transistor T6 is cyclically boosted above $V_{DD}$ by the precharging capacitor C4, a full $V_{DD}$ is provided to the drain of transistor T6, thus overcoming the threshold voltage loss in the output stage. However, the circuit has the disadvantage in that $V_{DD}$ must be at least greater than twice the threshold voltage, i.e. $V_{DD} \geq 2V_{TN}$. Thus, although this circuit solves the problem of the $V_{TN}$ loss in generating $V_{PP}$, it still has the problem that for low $V_{DD}$, i.e. close to $2V_{TN}$, the circuit will not work. Essentially, if an NMOS precharge circuit is used the low $V_{DD}$ problem will always be present. The reason why many designs choose to live with this problem is that by using NMOS precharge the greater problem of device latch-up is avoided.

It would therefore be advantageous to develop a high voltage generating circuit which provides the constant $V_{PP}$ output without any threshold voltage drop and which is capable of operating efficiently at low values of $V_{DD}$.

SUMMARY OF THE INVENTION

This invention seeks to provide a high voltage generating circuit for use in random access memories in which the output, $V_{PP}$, makes efficient use of a source supply voltage $V_{DD}$, is able to maintain its efficiency at low values of $V_{DD}$ and does not suffer from the dangers of latch-up.

In accordance with this invention there is provided a voltage boosting circuit for providing a boosted voltage $V_{PP}$ at an output node, from a supply voltage $V_{DD}$, the circuit comprising:

a precharge transistor element responsive to a precharge clock signal for transferring the supply voltage $V_{DD}$ to a boost node for precharging the boost node to the full supply voltage $V_{DD}$;

a capacitive element connected between the boost node and a pump node, the capacitive element pumping the boost node in response to a pump voltage signal applied to the pump node; and a switching element connected between the boost node and the output node, for transferring charge from the capacitive element to the output node to provide the boosted voltage $V_{PP}$.

In accordance with a further aspect of the invention the precharge transistor element is an PMOS transistor.

An advantage of the present invention is that no threshold voltage drop is experienced in the precharge section of an embodiment of the present invention as would be experienced in conventional NMOS precharge or NMOS pass type pump circuits since a PMOS precharge system is employed. Another advantage of the present invention is the elimination of the latch-up problem conventionally experienced in PMOS precharge systems. A further advantage of the present invention is significant power savings are achieved through the use of a self-biasing current comparator which monitors the value of the output voltage $V_{PP}$.

BRIEF DESCRIPTION OF THE DRAWINGS

A better understanding of the invention will be obtained by reference to the detailed description below in conjunction with the following drawings in which.

DETAILED DESCRIPTION OF PREFERRED EMBODIMENTS

Figure 1:
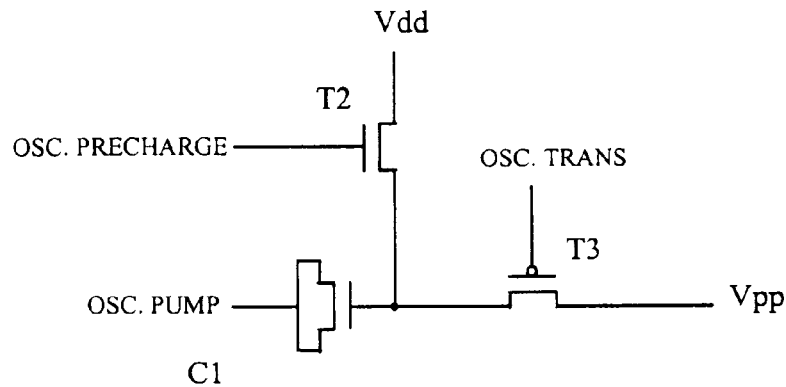
FIG. 1 is a circuit diagram of a single phase conventional NMOS precharge, PMOS pass $V_{PP}$ voltage generating circuit.
Figure 2:
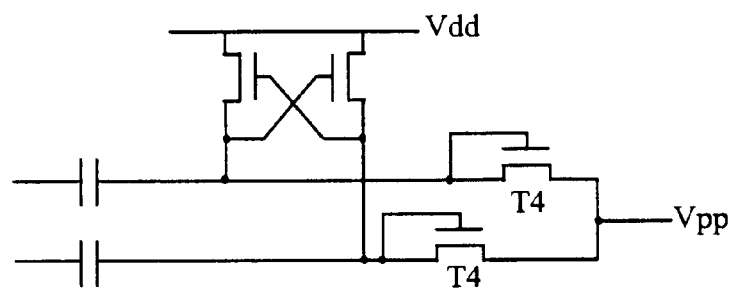
FIG. 2 is a circuit diagram of a two-phase conventional NMOS precharge, NMOS pass $V_{PP}$ voltage generating circuit using diode connected NMOS pass transistors.
Figure 3:
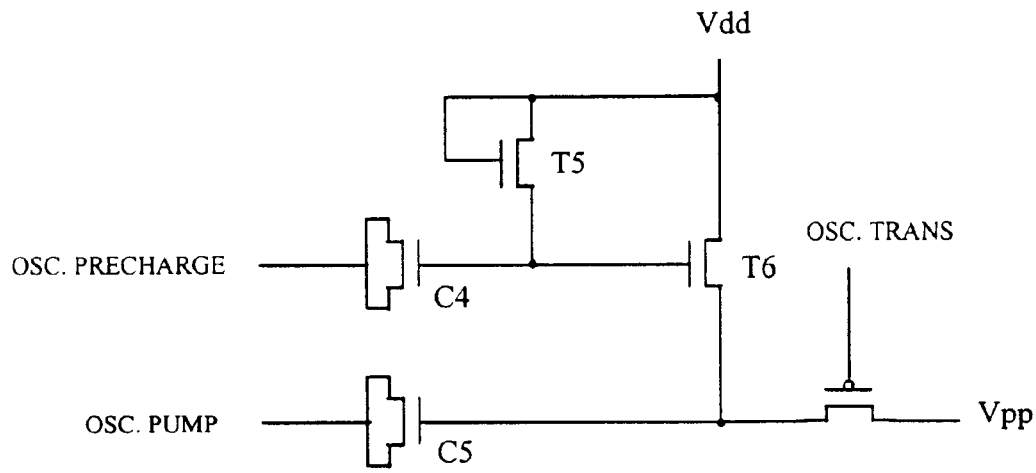
FIG. 3 is a circuit diagram of a conventional $V_{PP}$ voltage generating circuit for eliminating threshold voltage loss in the output.
Figure 4:
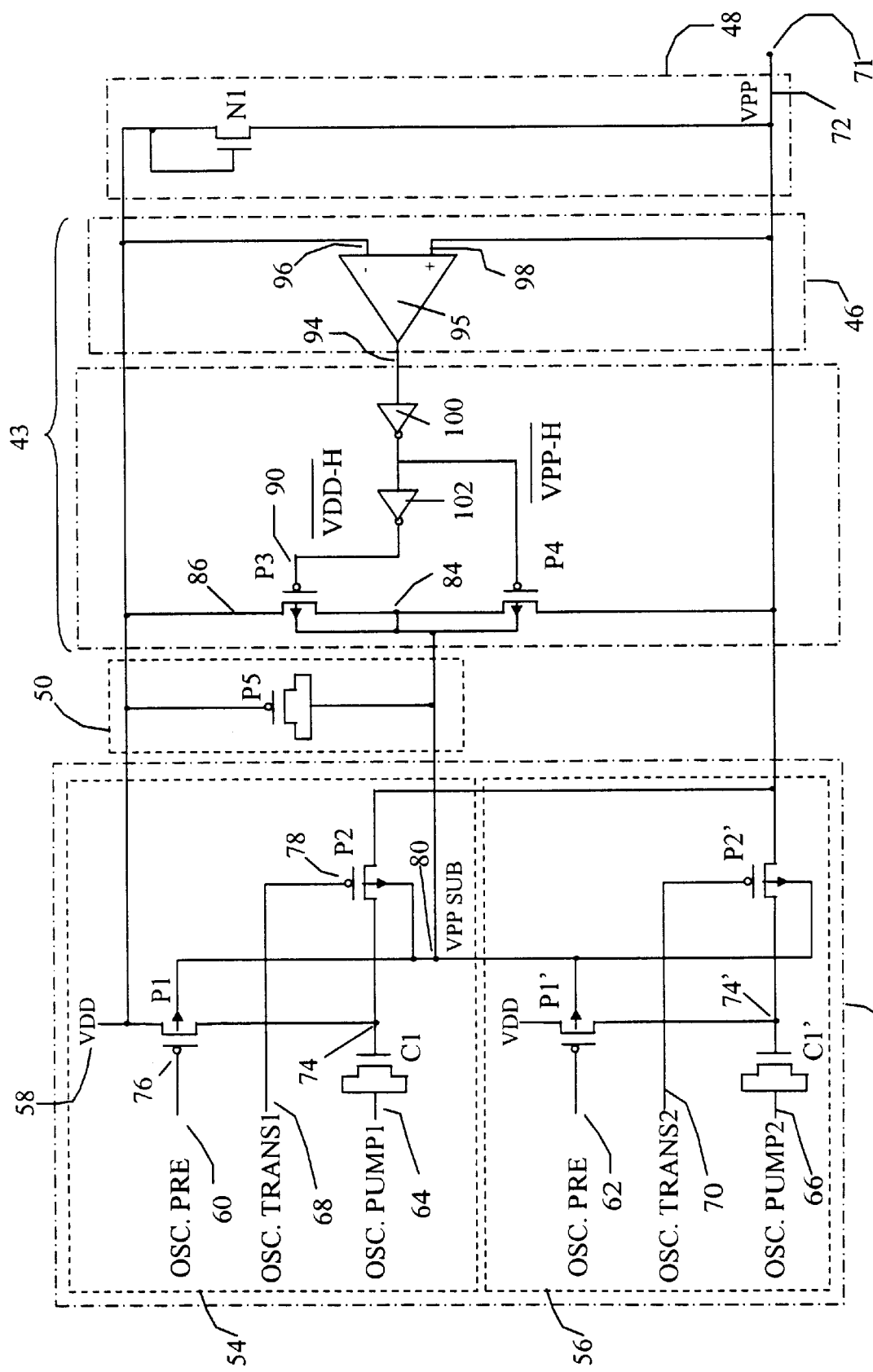
FIG. 4 is a circuit diagram of a $V_{PP}$ voltage generating circuit in accordance with the present invention.

Referring to FIG. 4, an embodiment of a voltage boost circuit in accordance with the present invention is shown generally by numeral 40. The voltage boost circuit includes a voltage pump section 42, an initial charge circuit 48 and a substrate biasing section 43, which in turn includes a substrate switching section 44 and a voltage comparator circuit 46. The voltage boost circuit 40 also includes a power-up pre-conditioning device 50. In addition, the voltage pump section 42 consists of a first and second identical charge pump circuits 54 and 56, respectively.

The voltage boost circuit 40 is provided with an external power supply having a source supply voltage $V_{DD}$ 58. The circuit 40 is controlled by signals that include: a first and second oscillator pre-charge signals OSC_PRE1 60 and OSC_PRE2 62, respectively; a charge pump signal OSC_PUMP1 64 and OSC_PUMP2 66, respectively; and first and second charge transfer signals OSC_TRANS1 68 and OSC_TRANS2 70, respectively. These signals control the generation of the $V_{PP}$ voltage 72 in a manner to be described below.

Considering firstly, the first charge pump circuit 54 (the second charge pump circuit 56 is identical) which includes a precharge PMOS transistor P1 having its source connected to $V_{DD}$ and its drain connected to a charge pumping capacitor C1 at a boost node 74. The charge pumping capacitor C1 is an NMOS device with its source and drain connected together at a pump node 64 which in turn is fed by the first charge pump signal OSC_PUMP1 64. The gate 76 of the pre-charge transistor P1 is fed by the first precharge oscillator clock signal OSC_PRE1 60. A PMOS pass transistor P2 provides a controllable charge transfer from the boost node 74 of capacitor C1 to the output node $V_{PP}$ 72. The gate 78 of the PMOS transistor P2 is controlled by the first charge transfer signal OSC_TRANS1 68.

A problem with PMOS transistors is the potential for latch-up. The PMOS devices reside in an n-well, which must be biased to a positive voltage level in order to avoid forward biasing the p–n regions formed by the source/drain implants (or diffusions), and the channel region located in the n-type material of the n-well. Such a forward bias would constitute the first step to causing CMOS latch-up. Since a PMOS device will have its body (or more commonly referred to as substrate) connected to the output $V_{PP}$ to ensure that the n-well is at the highest potential available, clearly, when $V_{DD}$ is low, $V_{PP}$ is even lower and this forward biasing problem becomes a significant threat.

The PMOS transistors P1 and P2 are formed in n-wells as is well known to persons skilled in the art. The n-wells are connected to the biasing node which is held at a voltage VPP_SUB 80. The region underneath the gate oxide where the channel is formed consists of the n-type material of the n-well. Traditionally, well contacts have loosely been referred to as substrate contacts in the art. In fact, n-wells act as a localized substrate for the PMOS devices. For this reason, the voltage biasing the well is referred to as VPP_SUB, (local) substrate connection for $V_{PP}$.

It should be noted that by using PMOS transistors for the precharge transistors PI and P1' which fully turn on when $V_{SS}$ is applied to their gates, there is no threshold voltage $V_{TN}$ loss during the precharging of the pump capacitor C1. Since the voltage at the gate 76 of PMOS P1 is at ground level $V_{SS}$, the PMOS device P1 is on.

In a PMOS device as previously mentioned, the n-well or local substrate must be connected to the most positive supply voltage in order to avoid forward biasing the PN junction formed between the p-type source/drain and the n-well. Thus, it may be seen that if the voltage VPP_SUB is less than $V_{DD}$ forward biasing of the aforementioned junction and eventual latch-up of the respective PMOS devices will occur, i.e. a large current will flow from $V_{DD}$ to VPP_SUB through the device that will eventually cause damage to the device. Thus, during power-up of the device and throughout the rest of other operation conditions, whenever $V_{DD}$ and consequently $V_{PP}$ is low, it is necessary to establish a system whereby the forward biasing of the PN junction and hence latch-up of the PMOS transistors is avoided.

The substrate voltage switch circuit 44 includes a pair of PMOS transistors P3 and P4 with their drains connected together at node 84 and the output taken from this node to the VPP_SUB node 80. The respective source terminals 86 and 88 of the transistors P3 and P4 are connected to $V_{DD}$ and $V_{PP}$, respectively. The substrate of each of these transistors is also connected to VPP_SUB in order to avoid undesired latch-up of these devices. The respective gates 90 and 92 of transistors P3 and P4 are connected to complementary switching signals $\overline{V_{DD}\_H}$ and $\overline{V_{PP}\_H}$, respectively.

The complementary switching signals $\overline{V_{DD\_H}}$ and $\overline{V_{PP\_H}}$ are derived from the output 94 of a voltage comparator 95 which has $V_{DD}$ connected to its inverting input 96 and $V_{PP}$ connected to its non-inverting input 98. A $V_{DD}$ level inverter 100 is provided at the output of the voltage comparator and inputs to the gate of transistor P4 as the $\overline{V_{PP\_H}}$ signal. A further $V_{PP}$ level inverter 102 is provided at the output of inverter 100 and inputs to the gate of transistor P3 as the $\overline{V_{DD\_H}}$ signal.

The operation of providing the optimum VPP_SUB voltage to the VPP driving transistors P1 and P1' will now be described. In order to ensure that VPP_SUB, i.e. the well potential of the PMOS transistors is always at the most positive potential, in accordance with the embodiment of the present invention illustrated in FIG. 4, the n-well contacts of the $V_{PP}$ generator, which are connected to the voltage VPP_SUB are selectively switched either to $V_{DD}$ or $V_{PP}$ by the substrate voltage switch circuit 44 according to whichever is more positive at the time.

When $V_{DD} > V_{PP}$, the output of the comparator 95 is low; this is passed through the level inverter 100 to set $\overline{V_{PP\_H}}$ high and thus turning off transistor P4. As a result, transistor P3 is turned on, pulling VPP_SUB to $V_{DD}$. When $V_{PP} > V_{DD}$, the output of the comparator 95 is high, driving the output of the level inverter 100 $\overline{V_{PP\_H}}$ low, therefore turning on transistor P4 and connecting VPP_SUB to $V_{PP}$. The level inverter 102 is provided with a $V_{PP}$ supply voltage in order to assure that the transistor P3 is fully turned off by applying $V_{PP}$ to its gate 90. Without this precaution, if only a $V_{DD}$ level is provided to node 90 when node 92 is low and $V_{PP}$ is higher than $V_{DD}$, leakage current will flow from node 84 to $V_{DD}$, thereby greatly reducing the efficiency of the pump.

A second capacitive element, namely, a PMOS transistor P5 is connected as a MOS capacitor between $V_{DD}$ and VPP_SUB. The transistor P5 is used to charge VPP_SUB when $V_{DD}$ is very low, i.e. $V_{DD} < V_{TN}$, by coupling the charge between $V_{DD}$ and VPP_SUB. During this period, neither P3 nor P4 will turn on. Device P5 also acts as a reservoir capacitor once $V_{PP}$ reaches its regulated level by damping sudden glitches in the $V_{PP}$ line.

Furthermore, an NMOS transistor N1 has gate-drain terminals connected to the $V_{DD}$ line and its source connected to $V_{PP}$. This transistor acts as a diode and helps to charge $V_{PP}$ during power-up by providing a direct and instantaneous current path between $V_{DD}$ and $V_{PP}$ while $V_{PP} < V_{DD} - V_{TN}$.

Figure 5A:
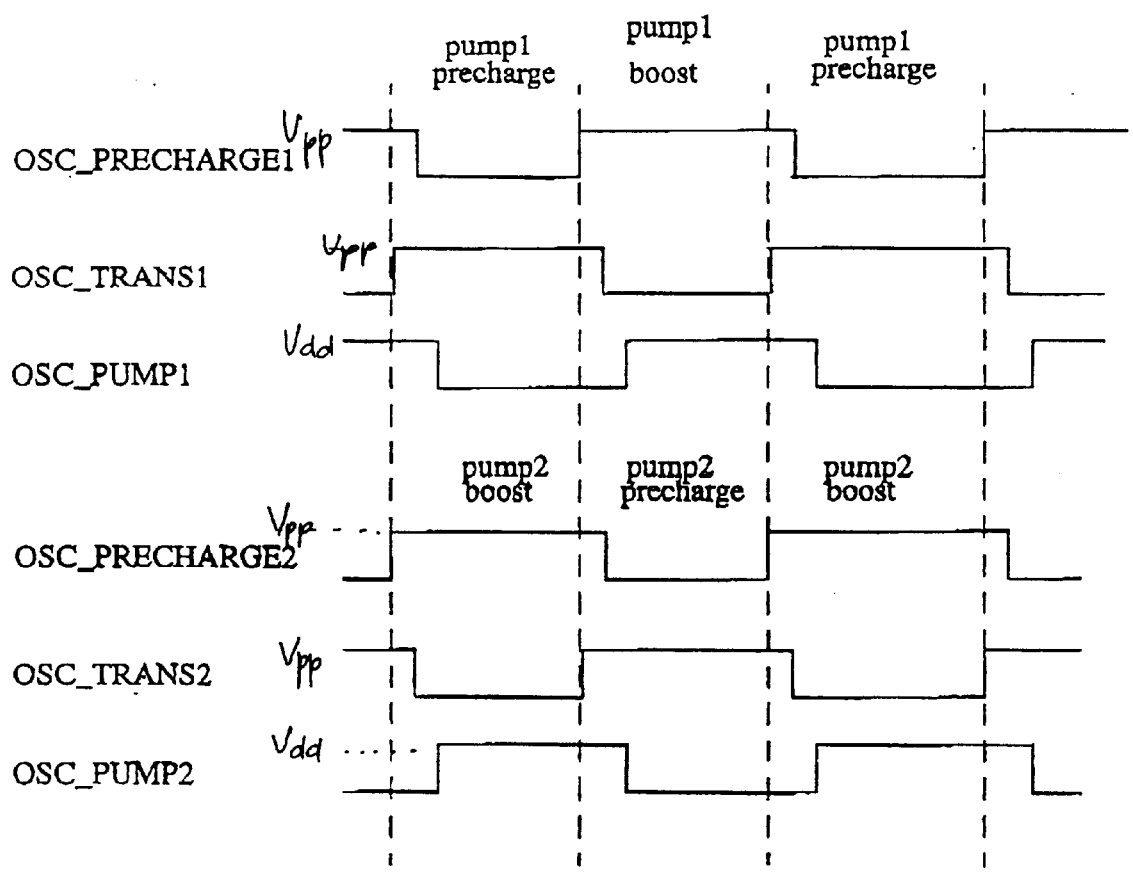
FIGS. 5(a) and (b) are waveform diagrams of representative components in FIG. 4.
Figure 5B:
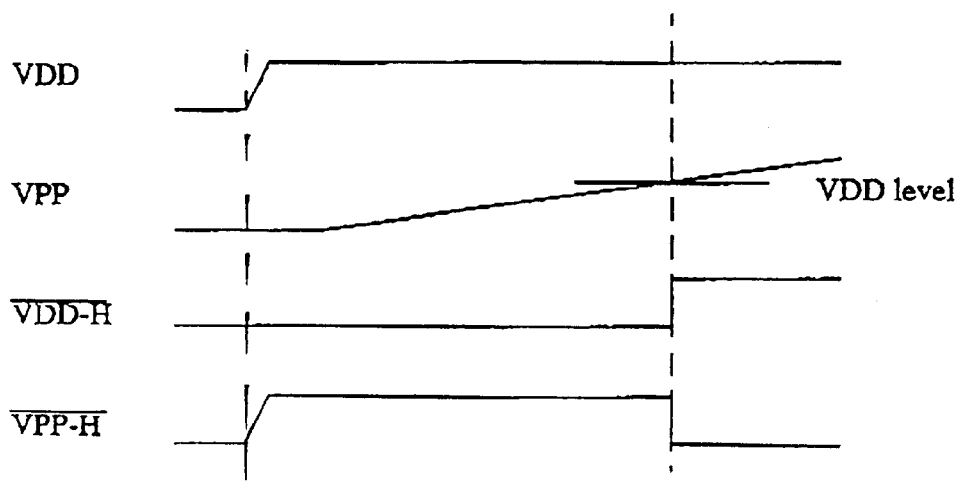

Referring now to FIGS. 5a and 5b, the actual VPP generating operation of the circuit of FIG. 4 is described. The circuit operates in two phases, i.e. a precharge phase and a boost phase. Because the capacitor C1 in FIG. 4 is used to charge up $V_{PP}$ in the boost phase, two boost circuits 54 and 56 are provided, each of which are driven by signals that are 180° out of phase. Thus, while the capacitor Cl in the first boost circuit is being precharged, the capacitor C1' is charging up $V_{PP}$. This results in a higher efficiency circuit.

Of further special importance are the levels of the oscillating signals. Both OSC_PUMP1 and OSC_PUMP2 are $V_{DD}$ level oscillating signals. However, both OSC_PRE1 and OCS_TRANS1 as well as OSC_PRE2 and OSC_TRANS2 are all $V_{PP}$ level oscillating signals. The reason for the increased voltage level required for these oscillating signals is to ensure that when the boost nodes 74 and 74' are at their high voltage values, the precharge transistors P1 and P1' are fully turned off. Only a $V_{PP}$ level signal at the gate of these respective precharge transistors will shut them off completely. A $V_{DD}$ level at their gates will allow leakage current to flow between the boost nodes and $V_{DD}$, resulting in significant power drain and a decrease in the pumping efficiency. The generation of the boosted level signals OSC_PRE1, OCS_TRANS1, OSC_PRE2 and OSC_TRANS2 can be accomplished through the use of conventional level shift circuits as described in U.S. Pat. No. 5,406,523 also assigned to the subject assignee.

FIG. 5a illustrates the sections of precharge and boosting for the two pumps. The alternating effect of having the output supplied with pumped charge every half oscillating cycle greatly increases the efficiency of the overall $V_{PP}$ generating circuit.

FIG. 5b illustrates the relative states of the $\overline{V_{DD\_H}}$ and $\overline{V_{PP\_H}}$ signals and the resulting $V_{PP}$ output.

Figure 6:
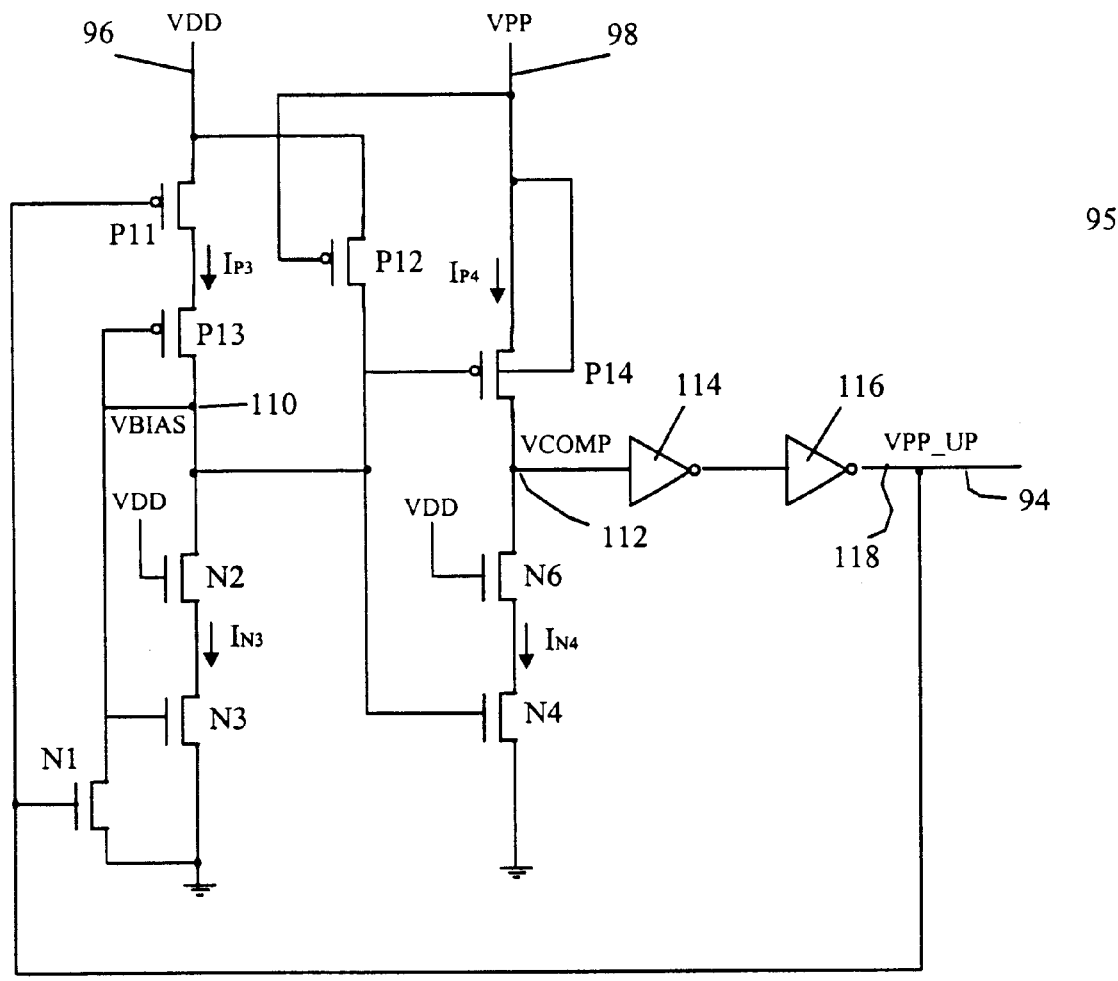
FIG. 6 is a circuit diagram of a comparator shown in FIG. 4.

Referring to FIG. 6, an embodiment of the voltage comparator 95, shown schematically in FIG. 4, is described. The comparator 95 consists of two symmetrical circuits, corresponding to the inverting input 96 and the non-inverting input 98, respectively. The core of the comparator consists of transistors P13, N3 and P14, N4. Transistors P13 and P14 are PMOS devices, whereas transistors N3 and N4 are NMOS devices. The transistor P13 is connected in series with the transistor N3 and the transistor P14 is connected in series with the transistor N4. The input voltage $V_{DD}$ is applied to the source of P3 via a PMOS transistor P11, having its drain connected to the source of P13 and its source connected to $V_{DD}$. The input $V_{PP}$ 98 is applied directly to the source of PMOS transistor P14. The gates of transistors P13, N3 and P14, N4 are connected together at node 110, i.e. VBIAS. Transistors N2 and N6 are connected in the series path between P13, N3 and P14, N4 respectively to provide protection against hot electron effects. The drains of transistors P14 and N6 are connected together at node 112 providing an output signal VCOMP. This output signal VCOMP is passed through a pair of series connected inverters 114 and 116 to provide an output signal VPP_UP 118. The output signal VPP_UP is fed back to the gate of the PMOS transistor P11 and the gate of an NMOS transistor N1 having its source and drain connected to the source and gate of transistor N3, respectively.

The circuit of FIG. 6, in operation, exhibits two significant features, namely, a quick set-up initialization at very low $V_{DD}$ and a no current drain or power loss for values of $V_{PP}$ greater than $V_{DD}$.

Because of the symmetry between the two parts of the circuit and the mutual connection of the four gates of devices P13, N3, P14, N4, the voltage VCOMP is one half the voltage $V_{DD}$ when $V_{DD}$ and $V_{PP}$ are equal. That is, the currents $I_{P3}$ and $I_{P4}$ through transistors P13 and P14, respectively, are equal. When $V_{PP}$ is less than $V_{DD}$, the current $I_{P4}$ is less than the current $I_{P3}$ and, therefore, the current $I_{N4}$ is greater than the current $I_{P4}$, resulting in more current flowing to ground, thus driving VCOMP low. It may be seen that the current through the transistors N3 and N4 are equal since their gates are connected together and because of the symmetry between the circuits. When VCOMP is low, VPP_UP is low, driving transistors P11 on and N1 off, thus causing $V_{DD}$ to supply the current for the $V_{PP}$ generator.

On the other hand, when $V_{PP}$ is greater than $V_{DD}$, the current $I_{P4}$ is greater than the current $I_{P3}$, therefore, $I_{P4}$ is also greater than $I_{N4}$. This drives VCOMP high. When VCOMP is high, the voltage of VPP_UP is also high. When applied to the gate of transistor P11, VPP_UP turns transistor P11 off. Since transistor P11 is off, there is no current flowing in the series branch made up of P11, P13, N2, and N3. Furthermore, when P11 is off, N1 is on and since this is an NMOS device with its drain connected to VBIAS and its source connected to ground, it drives VBIAS to ground. Since VBIAS is also applied to the gate of N4, this turns off transistor N4. By turning off N4, there is now no current flowing in the series branch made up of P14, N6 and N4. Therefore, when $V_{PP}$ is sufficiently high, there is no biasing current drawn from $V_{PP}$ or $V_{DD}$. It may thus be seen that this provides a power saving feature for the high voltage generating circuit.

In order to provide quick initialization of the circuit at low $V_{DD}$, the transistor P12 has its source connected to $V_{DD}$, its gate connected to $V_{PP}$ and its drain connected to VBIAS. On power-up when $V_{DD}$ rises from zero to $V_{PP}$, the voltage $V_{PP}$ is almost zero, thus the transistor P12 is on and VBIAS is then set equal to $V_{DD}$. The voltage VCOMP will go low because the transistor N4 is on and thus, VPP_UP is also driven low. Thus transistor P12 initializes all the key voltages in the comparator circuit in a stable manner on power-up.

Furthermore, the substrate (n-well connection) of PMOS transistor P14 needs only be connected to $V_{PP}$ since P14 is maintained in an off state as long as $V_{PP}$ is less than $V_{DD}$. As a result, the latch-up threat is not significant. Since the drain of a PMOS transistor P14 is connected to VCOMP which should not be greater than $V_{PP}$. As a result there is little risk of latch-up and no need to connect the local substrate contact to VPP_SUB.

As has been illustrated in an embodiment of the present invention, several advantages over the prior art are accomplished with simple and robust solutions. Specifically, the latch-up problem experienced in conventional PMOS precharge circuits has been addressed. No threshold voltage drop experienced in conventional NMOS precharge or NMOS pass type pump circuits exists since a PMOS precharge system is employed. Furthermore, power savings are achieved through the use of a self-biasing current comparator which monitors the value of the output voltage $V_{PP}$.

While the invention has been described in connection with a specific embodiment thereof and in a specific use, various modifications thereof will occur to those skilled in the art without departing from the spirit of the invention as set forth in the appended claims.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the claims to the invention.

We claim:

1. A voltage boosting circuit for providing a boosted voltage $V_{PP}$ at an output node, from a supply voltage $V_{DD}$, said circuit comprising:
   a) a precharge transistor element responsive to a precharge clock signal for transferring said supply voltage $V_{DD}$ to a boost node for precharging said boost node to said fill supply voltage $V_{DD}$, said precharge transistor having its local substrate connected to a biasing node;
   b) a capacitive element connected between said boost node and a pump node, said capacitive element pumping said boost node in response to a pump voltage signal applied to said pump node;
   c) a switching element connected between said boost node and said output node, for transferring charge from said capacitive element to said output node to provide said boosted voltage $V_{PP}$; and
   d) a biasing circuit for maintaining said biasing node at a higher one of said $V_{DD}$ and $V_{PP}$ voltages, whereby latch-up of said precharge transistor element is prevented.

2. A circuit as defined in claim 1, said precharge transistor element being an PMOS transistor.

3. A circuit as defined in claim 1, said switching element being an PMOS transistor.

4. A circuit as defined in claim 1, said substrate biasing circuit including a substrate switching circuit responsive to a switching signal for selectively connecting said substrate biasing node to a higher voltage of either said boosted voltage $V_{PP}$ or said supply voltage $V_{DD}$.

5. A circuit as defined in claim 4, including a voltage comparator means for generating said switching signal.

6. A circuit as defined in claim 1, including a second capacitive element connected between said substrate biasing node and said supply voltage, for coupling charge between said supply and said biasing node.

7. A circuit as defined in claim 1, including a diode element connected between said supply voltage $V_{DD}$ and said output node, for directly charging said output node when said output node is at a voltage less than said supply voltage $V_{DD}$.

8. A circuit as defined in claim 7, said diode element being an NMOS transistor, having its gate-drain terminals connected to said supply voltage $V_{DD}$ and its source terminal connected to said output node.

9. A circuit as defined in claim 1, said precharge signal being a $V_{PP}$ level oscillating signal.

10. A circuit as defined in claim 1, said pump voltage signal being a $V_{DD}$ level oscillating signal.

11. A circuit as defined in claim 3, said switching element transistor being responsive to a transfer signal.

12. A circuit as defined in claim 11, said transfer signal being a $V_{PP}$ level oscillating signal.

13. A circuit as defined in claim 5, said voltage comparator means including
   a) an first output node for outputting said switching signal;
   b) a first current path defined between a first input node and a ground node, said first input node for coupling said supply voltage $V_{dd}$ thereto;
   c) a second current path defined between a second input node and said ground node, said second input node for coupling said boosted voltage $V_{PP}$ thereto;
   d) a first driver element connected to said first input node in said first current path;
   e) a second driver element connected between said second input node and said first output node in said second current path;
   f) a first load element connected in said first current path;
   g) a second load element connected in said second current path between said first output node and said ground node; said first and second load element being coupled such that currents through said first and second load elements and said first driver elements are equal; and whereby said first output node is driven high upon said current in said first current path being less than current through said second driver and said first output being driven low upon said current in said first current path being greater than current through said second driver element.

14. A circuit as defined in claim 13, said voltage comparator including a power saving means for reducing current in said first and second current paths when said boost voltage exceeds said supply voltage.

15. A circuit as defined in claim 13, said voltage comparator including initialization means for initializing voltages in said comparator circuit upon power-up.

16. A voltage boosting circuit for providing a boosted voltage $V_{PP}$ at an output node, from a supply voltage $V_{DD}$, said circuit comprising
   a) a PMOS precharge transistor element responsive to a precharge clock signal for transferring said supply voltage $V_{DD}$ to a boost node for precharging said boost node to said full supply voltage $V_{DD}$;
   b) a capacitive element connected between said boost node and a pump node, said capacitive element pumping said boost node in response to a pump voltage signal applied to said pump node;
   c) a PMOS transistor switching element connected between said boost node and said output node, for transferring charge from said capacitive element to said output node to provide said boosted voltage $V_{PP}$; and
   d) said PMOS transistor elements having their substrates connected to a biasing node and including a substrate switching circuit responsive to a switching signal for selectively connecting said substrate biasing node to a higher voltage of either said boosted voltage $V_{PP}$ or said supply voltage $V_{DD}$, whereby latch-up of said PMOS transistors is prevented.

17. A method of providing a boosted voltage $V_{PP}$ at an output node, from a supply voltage $V_{DD}$, said method comprising the steps of:
   a) precharging a boost node to said full supply voltage $V_{DD}$ with a precharge transistor element responsive to a precharge clock signal for transferring said supply voltage $V_{DD}$ to said boost node said precharge transistor element having its local substrate connected to a biasing node;
   b) pumping said boost node with a capacitive element connected between said boost node and a pump node, in response to a pump voltage signal applied to said pump node;
   c) transferring charge from said capacitive element to said output node to provide said boosted voltage $V_{PP}$ with a switching element connected between said boost node and said output node; and
   d) maintaining said biasing node at a higher one of said $V_{DD}$ and $V_{PP}$ voltages, whereby latch-up of said precharge transistor element is prevented.

* * * * *